(12) United States Patent
Ukawa et al.

(10) Patent No.: US 12,471,420 B2
(45) Date of Patent: *Nov. 11, 2025

(54) LIGHT EMITTING DEVICE (71) Applicant: NICHIA CORPORATION, Anan (JP)

(72) Inventors: Hiroaki Ukawa, Itano-gun (JP); Ryo Iwasa, Anan (JP)

(73) Assignee: NICHIA CORPORATION, Anan (JP)

( * ) Notice: Subject to any disclaimer, the term of this patent is extended or adjusted under 35 U.S.C. 154(b) by 648 days.

This patent is subject to a terminal disclaimer.

(21) Appl. No.: 17/375,466

(22) Filed: Jul. 14, 2021

(65) Prior Publication Data

US 2021/0343917 A1     Nov. 4, 2021

Related U.S. Application Data

(63) Continuation of application No. 16/365,334, filed on Mar. 26, 2019, now Pat. No. 11,094,864.

(30) Foreign Application Priority Data

Mar. 27, 2018 (JP) .................................. 2018-060304

(51) Int. Cl.
*H10H 20/857* (2025.01)
*H10H 20/85* (2025.01)
(Continued)

(52) U.S. Cl.
CPC ...... *H10H 20/857* (2025.01); *H10H 20/8506* (2025.01); *H10H 20/853* (2025.01);
(Continued)

(58) Field of Classification Search
CPC ... H01L 33/62; H10H 20/8506; H10H 20/852
See application file for complete search history.

(56) References Cited

U.S. PATENT DOCUMENTS

2008/0298063 A1* 12/2008 Hayashi .............. H01L 25/0753
425/544
2012/0001312 A1    1/2012 Nishino et al.
(Continued)

FOREIGN PATENT DOCUMENTS

JP     2010-114387 A    5/2010
JP     2012-033884 A    2/2012
(Continued)

OTHER PUBLICATIONS

Non-Final Office Action on U.S. Appl. No. 16/365,334 Dtd Dec. 31, 2020.
(Continued)

*Primary Examiner* — Ali Naraghi
(74) *Attorney, Agent, or Firm* — Foley & Lardner LLP (57) ABSTRACT

A light emitting device includes: a base member including: a first lead, a second lead, and resin member supporting the first lead and the second lead, wherein each of a surface of the first lead that includes a first surface, a surface of the second lead, and a surface of the resin member that includes a second surface are positioned at an upper surface of the base member; a light emitting element located at the surface of the first lead; a resin frame located at the upper surface of the base member, where the first surface and at least a portion of the second surface are exposed inward of the resin frame; and a reflective member covering at least a portion of the second surface. Projections are located on the upper surface of the resin member that forms a portion of the upper surface of the base member.

4 Claims, 6 Drawing Sheets

(51) Int. Cl.
  *H10H 20/851* (2025.01)
  *H10H 20/853* (2025.01)
  *H10H 20/856* (2025.01)
(52) U.S. Cl.
  CPC . *H10H 20/856* (2025.01); *H01L 2224/48091* (2013.01); *H01L 2224/48095* (2013.01); *H10H 20/8512* (2025.01)

(56) References Cited

U.S. PATENT DOCUMENTS

| | | | |
|---|---|---|---|
| 2012/0106118 A1* | 5/2012 | Liaw | H01L 25/167 361/813 |
| 2012/0211789 A1* | 8/2012 | Lee | H10H 20/857 257/E33.061 |
| 2013/0193845 A1* | 8/2013 | Kobayakawa | H05B 33/10 313/512 |
| 2013/0221509 A1* | 8/2013 | Oda | H10H 20/857 257/676 |
| 2013/0256721 A1* | 10/2013 | Chang | H01L 25/167 257/E33.059 |
| 2014/0085884 A1* | 3/2014 | Horio | H01L 25/0753 362/249.02 |
| 2014/0087498 A1 | 3/2014 | Terayama et al. | |
| 2015/0340569 A1 | 11/2015 | Tamaki et al. | |
| 2016/0005942 A1* | 1/2016 | Ukawa | H10H 20/855 438/27 |
| 2016/0069517 A1 | 3/2016 | Horio et al. | |
| 2017/0040499 A1* | 2/2017 | Ushiyama | H10H 20/854 |
| 2017/0092816 A1 | 3/2017 | Ikeda et al. | |
| 2017/0186927 A1 | 6/2017 | Naka et al. | |
| 2017/0213944 A1 | 7/2017 | Naka et al. | |
| 2017/0288104 A1 | 10/2017 | Ukawa et al. | |
| 2018/0097150 A1 | 4/2018 | Ikeda et al. | |
| 2018/0119890 A1 | 5/2018 | Horio et al. | |
| 2018/0204986 A1* | 7/2018 | Imai | H10H 20/8513 |
| 2018/0212117 A1* | 7/2018 | Yu | H01L 25/167 |
| 2018/0226551 A1 | 8/2018 | Naka et al. | |
| 2018/0315912 A1* | 11/2018 | Yun | H10H 20/856 |

FOREIGN PATENT DOCUMENTS

| | | |
|---|---|---|
| JP | 2013-206895 A | 10/2013 |
| JP | 2014-067846 A | 4/2014 |
| JP | 2014-082453 A | 5/2014 |
| JP | 2017-034133 A | 2/2017 |
| JP | 2017-069539 A | 4/2017 |
| JP | 2017-076765 A | 4/2017 |
| JP | 2017-120889 A | 7/2017 |
| JP | 2017-130640 A | 7/2017 |
| JP | 2017-183578 A | 10/2017 |

OTHER PUBLICATIONS

Notice of Allowance on U.S. Appl. No. 16/365,334 Dtd Apr. 16, 2021.

* cited by examiner

LIGHT EMITTING DEVICE

CROSS-REFERENCE TO RELATED APPLICATIONS

The present application is a continuation of U.S. patent application Ser. No. 16/365,334, filed on Mar. 26, 2019, which claims priority to Japanese Patent Application No. 2018-060304, filed on Mar. 27, 2018, the disclosures of which are hereby incorporated by reference in their entireties.

BACKGROUND

The present disclosure relates to a light emitting device.

Light emitting devices employing a light emitting element such as a light emitting diode or a laser diode have a variety of uses including general lighting, such as indoor lighting; vehicular light sources; and backlight for liquid crystal displays. Such light emitting devices are expected to provide further enhanced performance and reliability.

A base member on which a light emitting element is mounted may be a ceramic-based base member, for example, alumina or aluminum nitride base member provided with wirings. Alternatively, a base member may be a resin package integrally molded with a lead frame. Further, known examples include a light emitting device including a base member integrally molded with a lead frame, on which a resin frame surrounding a light emitting element is formed (for example, see Japanese Patent Publication No. 2013-206895).

The light emitting devices employing a light emitting element are expected to exhibit further efficient extraction of light from the light emitting element as their usage is widespread.

Accordingly, the present disclosure is intended to provide a light emitting device that exhibits good light extraction efficiency of a light emitting element.

SUMMARY

A light emitting device according to certain embodiment of the present disclosure includes: a base member, a light emitting element, a resin member. The base member includes a first lead and a second lead. The base member supports the first lead and the second lead, and has a surface of the first lead including a first surface, a surface of the second lead, and a surface of the resin member including a second surface, each positioned at an upper surface of the base member. The light emitting element is provided at the surface of the first lead configuring a portion of the upper surface of the base member. The resin frame is provided at the upper surface of the base member so as to surround the light emitting element, and provided such that the first surface and at least a portion of the second surface are exposed inward of the resin frame. At least a portion of the second surface is covered with a reflecting member.

The light emitting device according to one embodiment of the present disclosure as described above exhibits good light extraction efficiency of the light emitting element.

DETAILED DESCRIPTION

In the following, a description will be given of an embodiment of the present disclosure with reference to the drawings. Certain embodiments of a light emitting device are described below for explaining the technical ideas of the present disclosure. However, the present invention is not limited to the embodiments described below.

Further, members recited in the claims are not limited to the members described in the below embodiments. In particular, unless otherwise specified, the present invention is not limited to the sizes, materials, shapes, and relative dispositions of constituent components described below. The size, positional relationship and the like of members shown in the drawings may be exaggerated for the sake of clarity. Further, in the following description, identical names and reference characters denote identical or similar members, and the detailed description thereof will be omitted as appropriate.

Figure 1:
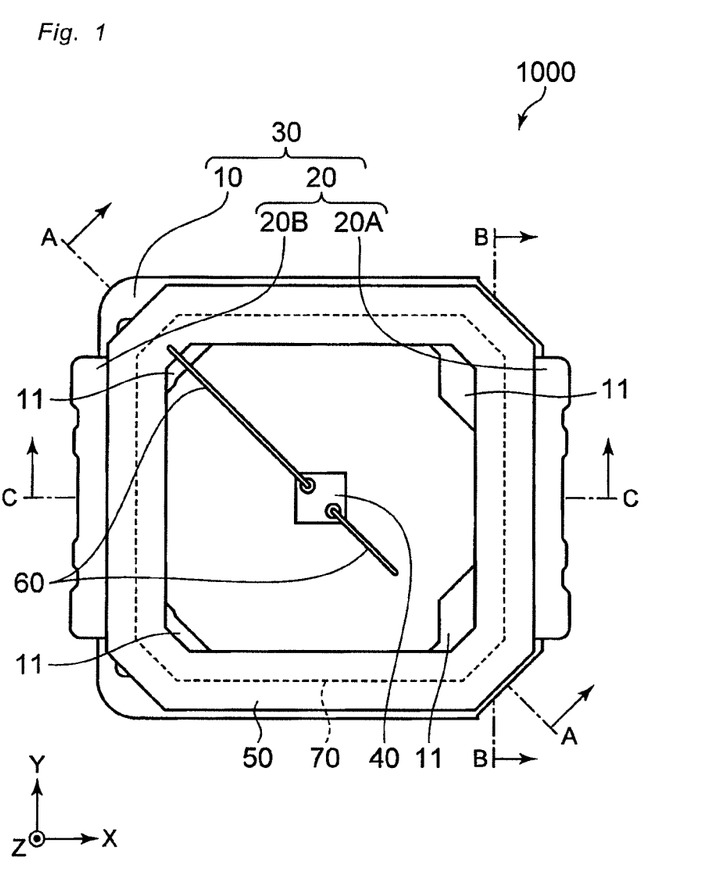
FIG. 1 is a top view of a light emitting device according to an embodiment of the present disclosure.

As shown in FIG. 1 and others, a light emitting device according to an embodiment includes a base member 30, a light emitting element 40 provided at an upper surface of the base member 30, a resin frame 50 formed at the upper surface of the base member 30 so as to surround the light emitting element 40 at the upper surface of the base member 30, and an encapsulation member 70 encapsulating the light emitting element 40 on the side inward of the resin frame 50.

The base member 30 includes a first lead 20A, a second lead 20B, and a resin member 10 supporting the first lead 20A and the second lead 20B. The upper surface of the base member 30 includes a surface of the first lead 20A, a surface of the second lead 20B, and a surface of the resin member 10.

The light emitting element 40 is provided at the surface of the first lead 20A in the upper surface of the base member 30.

The resin frame 50 is provided at the upper surface of the base member 30 so as to surround the light emitting element 40 and to expose part of the surface of the first lead 20A and part of the surface of the resin member 10 inward of the resin frame 50.

In an upper surface 31 of the base member 30, the surface of the first lead 20A in the region inward of the resin frame 50 is referred to as a first surface 25, and the surface of the resin member 10 in the region inward of the resin frame 50 is referred to as a second surface 15 in the following description.

In the light emitting device according to the embodiment, the second surface 15, part of the surface of the resin member 10 exposed inward of the resin frame 50 is covered with a reflecting member 11. This can prevent or alleviate light emitted by the light emitting element 40 from being absorbed by the resin member 10, and realizes efficient extraction of light emitted by the light emitting element 40.

In the following, a detailed description will be given for the light emitting device according to the embodiment.

1. Technical Meaning of Reflecting Member 11 in Light Emitting Device According to Embodiment A light emitting device 1000 according to the embodiment includes the light emitting element 40 and the resin frame 50 surrounding the light emitting element 40. The light emitting element 40 and the resin frame 50 are disposed on the upper surface of the base member 30. On the side inward of the resin frame 50, the light emitting element 40 is encapsulated, and light emitted by the light emitting element 40 is extracted to the outside via the encapsulation member 70. In the above-described structure, for light emitted by the light emitting element 40 to be efficiently extracted, light emitted by the light emitting element 40 should be reflected at the upper surface of the base member 30 so as to be extracted upward. To this end, it may be contemplated to increase the ratio of the surface of the first lead 20A with respect to the entire upper surface of the base member 30 inward of the resin frame 50. The surface of the first lead 20A is formed using metal of which reflectivity to light is relatively high. However, there are restrictions when reducing the surface area of the resin member 10 (e.g., the second surface 15) exposed inward of the resin frame 50.

Firstly, the base member 30 is structured in which the first lead 20A and the second lead 20B are supported by the resin member while being electrically separated from each other. A function of the resin member 10 is to securely support the first lead 20A and the second lead 20B while the first lead 20A and the second lead 20B remain insulated from each other. Therefore, a restriction on the structure is that is, it is difficult to reduce the ratio of the surface of the resin member 10 with respect to the upper surface of the base member 30 by a certain amount.

Alternatively, the reflectivity of the resin member 10 itself can be enhanced by including a filler such as titanium oxide in the resin member 10.

However, the resin member 10 is required to securely support the first lead 20A and the second lead 20B while electrically insulating the first lead 20A and the second lead 20B from each other. It is difficult to provide the resin member 10 with the function of mechanically supporting the leads and the reflecting function.

Further, the base member 30 is formed by, for example, setting the first lead 20A and the second lead 20B in a mold, and injecting molding resin into a predetermined range including the region between the first lead 20A and the second lead 20B. Hereinafter, the "molding resin" refers to uncured resin that is to form the resin member 10.

Accordingly, in the case where the base member 30 is formed by molding, it is desirable to define a certain area in the region for allocating the injection hole for injecting molding resin. Thus, there is also a restriction in reducing the ratio of the surface of the resin member 10 with respect to the upper surface of the base member by a certain amount.

Furthermore, demand for reducing the size of the device is ever increasing. Under such a condition, if a certain surface area of the resin member 10 is sufficiently ensured to securely support the first lead 20A and the second lead 20B while they are electrically insulated from each other, the ratio of the resin member 10 tends to increase with respect to the entire base member. That is, if the surface area of the resin member 10 is reduced by the percentage identical to the base member 30, the interval between the first lead 20A and the second lead 20B becomes narrow. As a result, the insulation between the leads or the strength as the supporting body may be insufficient.

Accordingly, it is difficult to reduce the ratio of the surface of the resin member 10 to the upper surface of the base member 30.

In the present embodiment, the reflecting member covers the surface (e.g., the second surface 15) of the resin member 10 exposed at the upper surface of the base member 30 inward of the resin frame 50, thus light absorption by the resin member 10 can be alleviated.

In the following, a description will be given of the specific structure of the light emitting device according to the embodiment.

2. Specific Structure of Light Emitting device 1000 According to Embodiment Base Member 30

Figure 2A:
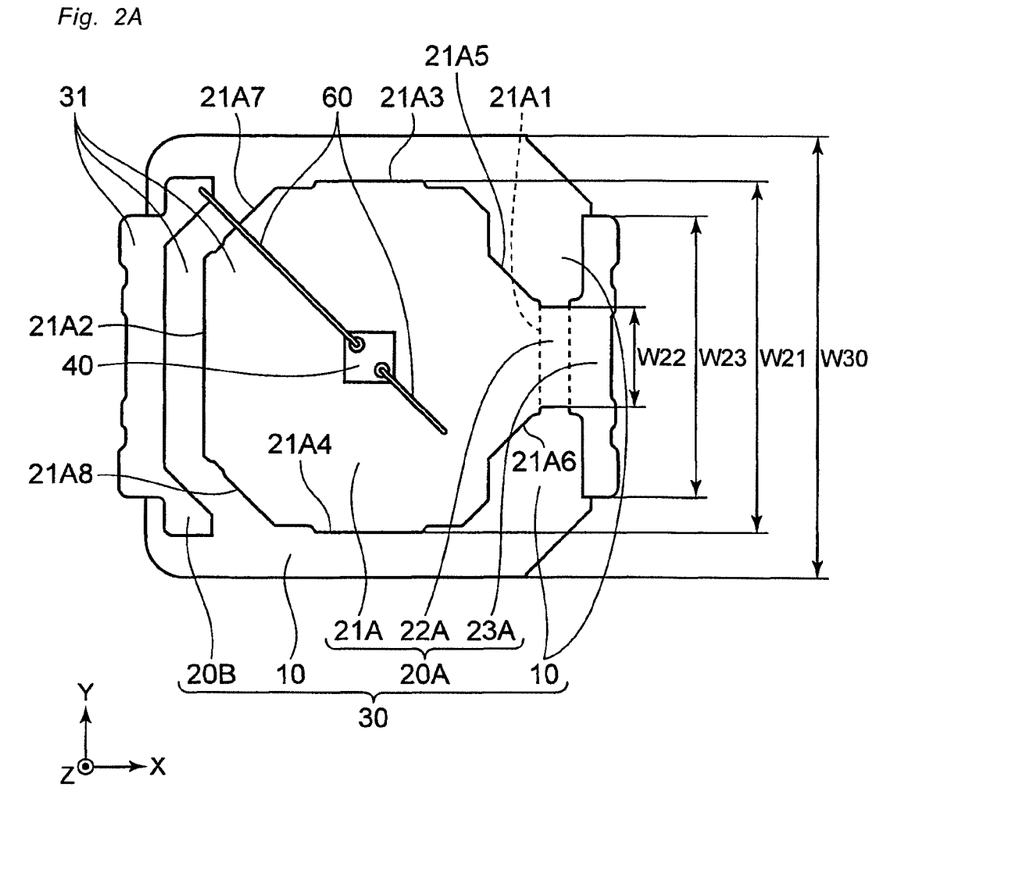
FIG. 2A is a top view of the light emitting device according to the embodiment without showing a resin frame and an encapsulation member.
Figure 3A:
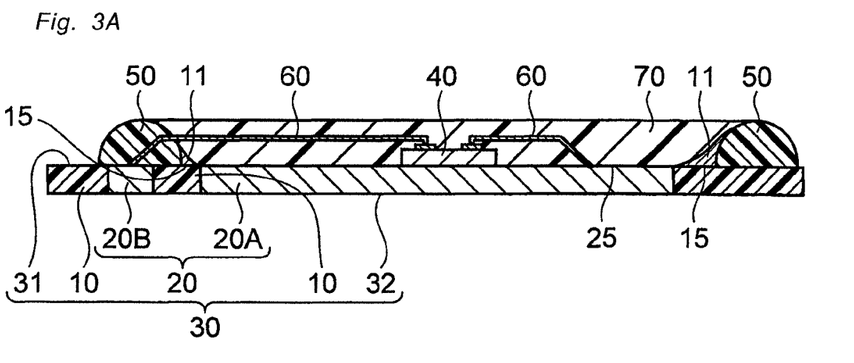
FIG. 3A is a cross-sectional view taken along line A-A in FIG. 1.
Figure 3B:
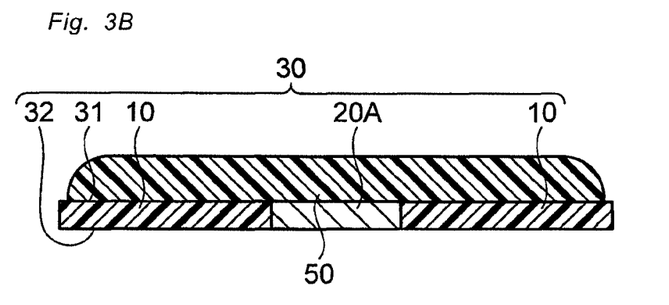
FIG. 3B is a cross-sectional view taken along line B-B in FIG. 1.

As shown in FIG. 3A, the base member 30 includes the resin member 10 and a conductive member 20 including the first lead 20A and the second lead 20B. Further, the base member 30 has the upper surface 31 and a lower surface 32. The upper surface 31 and the lower surface 32 each include the surface of the first lead 20A, the surface of the second lead 20B, and the surface of the resin member 10. As shown in FIG. 2A and others, the first lead 20A includes a large-width part 21A being, for example, substantially polygonal, a terminal part 23A, and a connecting part 22A connecting between the large-width part 21A and the terminal part 23A. A width W22 of the connecting part 22A is narrower than a width W21 of the large-width part 21A and a width W23 of the terminal part 23A. In the present specification, the "width" refers to the maximum length in the direction perpendicular to the direction extending from the large-width part 21A to the connecting part 22A large-width.

In more detail, the large-width part 21A includes:
(1) a first side 21A1 being the boundary with the connecting part 22A and having a length as great as the width W22 of the connecting part 22A;
(2) a second side 21A2 being substantially parallel and opposing to the first side 21A1;
(3) a third side 21A3 being substantially perpendicular to the first side 21A1 and the second side 21A2;
(4) a fourth side 21A4 being substantially perpendicular to the first side 21A1 and the second side 21A2 and opposing to the third side 21A3;
(5) a fifth side 21A5 being inclined and connecting the first side 21A1 and the third side 21A3;
(6) a sixth side 21A6 being inclined and connecting the first side 21A1 and the fourth side 21A4;
(7) a seventh side 21A7 being inclined and connecting the second side 21A2 and the third side 21A3; and
(8) an eighth side 21A8 being inclined and connecting between the second side 21A2 and the fourth side 21A4. The large-width part 21A is formed substantially polygonal as seen in a top view.

In the present embodiment, the second side 21A2 of the large-width part 21A is longer than the first side 21A1.

For example, the length W23 in the longitudinal direction of the terminal part 23A is longer than the second side 21A2 of the large-width part 21A. The portions between the terminal part 23A and two inclined sides of the large-width part 21A. In other words, the portion of the large-width part 21A between the terminal part 23A and the fifth side 21A5 becomes gradually wider farther away from the connecting part 22A, as well as the portion of the large-width part 21A between the terminal part 23A and the sixth side 21A6 becomes wider farther away from the connecting part 22A. Then, the resin member 10 is formed around the large-width part 21A from the connecting part along the regions where the large-width part 21A increases in width.

The second lead 20B is disposed with a constant interval from the large-width part 21A. Specifically, the length of the second lead 20B from one end to the other end in the longitudinal direction is substantially as great as the width W21 of the large-width part 21A, the one end and the other end in the longitudinal direction being bent inward. The side of the second lead 20B opposing to the large-width part 21A is bent at one end and the other end so as to respectively oppose and to be respectively parallel to the seventh side 21A7 and the eighth side 21A8 of the large-width part 21A.

In the base member 30, the resin member 10 is provided around the large-width part 21A of the first lead 20A, around the one end and the other end of the second lead 20B, and in the region between the second lead 20B and the first lead 20A, while supporting the first lead 20A and the second lead 20B. The resin member 10 is formed by, for example, injecting molding resin from two regions (i.e., resin injecting parts) where its width increases from the connecting part 22A toward the second lead 20B, in other words, a region between the terminal part 23A and the fifth side 21A5 of the large-width part 21A, and a region between the terminal part 23A and the sixth side 21A6 of the large-width part 21A, so that the molding resin is supplied to the region between the second lead 20B and the first lead 20A, around the large-width part 21A of the first lead 20A, and around the one end and the other end of the second lead 20B. In this manner, by the molding resin being injected from two resin injecting parts each becoming gradually wider when moving away from the connecting part 22A, the molding resin can easily reach the region furthest away from the resin injecting parts, for example, the region between the second lead 20B and the first lead 20A. Further, in the light emitting device according to the embodiment, the large-width part 21A of the first lead 20A is substantially polygonal, the corners of the polygon being provided by the fifth side 21A5, the sixth side 21A6, the seventh side 21A7, and the eighth side 21A8 each being inclined. Thus, the resin member 10 easily forms around the large-width part 21A of the first lead 20A, around the one end and the other end of the second lead 20B, and in the region between the second lead 20B and the first lead 20A.

Light Emitting Element 40

The light emitting element 40, exemplarily shown herein, has its upper surface serving as the light emitting surface, on which an n-electrode and a p-electrode are provided. While FIG. 1 and others show the upper surface of the light emitting element 40 having a quadrangular shape, the shape of the upper surface may be appropriately determined. The light emitting element 40 is mounted face-up on the first surface 25 of the first lead 20A, with the upper surface being the light emitting surface oriented upward. A bonding member that bonds the light emitting element 40 and the first lead 20A to each other may be a known bonding member which is electrically insulative or conductive. The n-electrode and the p-electrode of the light emitting element 40 are respectively connected to the first lead 20A and the second lead 20B via wires 60. The n-electrode and the p-electrode of the light emitting element 40 may be respectively connected to the second lead 20B and the first lead 20A via the wires 60.

Resin Frame 50

Figure 2B:
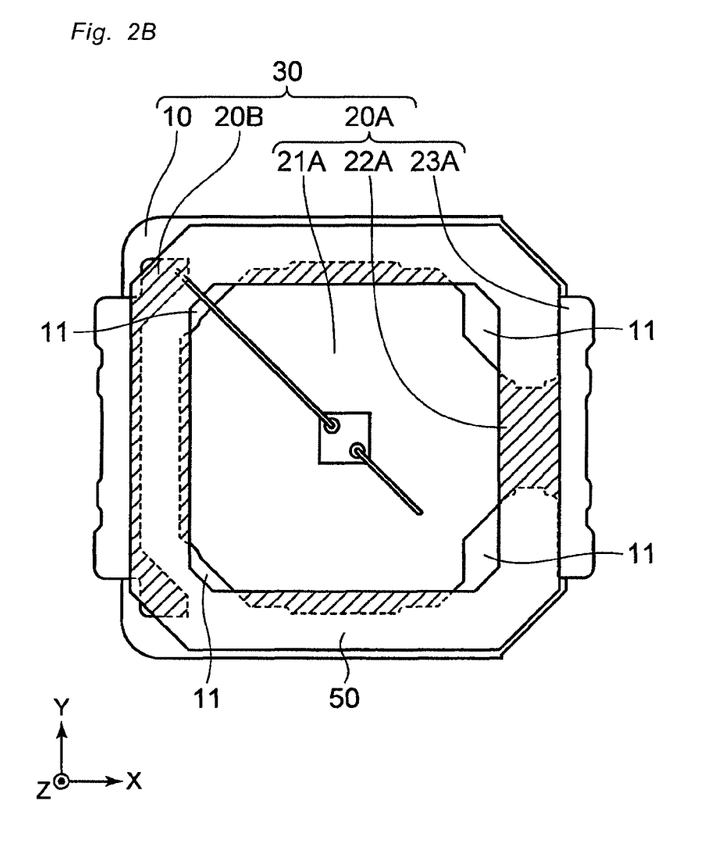
FIG. 2B is a top view of the light emitting device according to the embodiment of the present disclosure without showing the encapsulation member.

In the light emitting device according to the embodiment, as shown in FIG. 2B, the resin frame 50 is formed such that at least a part of the outer edge of the large-width part 21A of the first lead 20A covers at least a portion of the large-width part 21A and to expose at least a portion of the surface (e.g., the second surface 15) of the resin member 10 inward of the resin frame 50. In FIG. 2B, those sites of the first lead 20A and the second lead 20B being covered with the resin frame 50 are hatched. In the light emitting device according to the embodiment, as shown in FIG. 2B, the resin frame 50 is formed to cover the first lead 20A by a predetermined width along the first side 21A1, the second side 21A2, the third side 21A3, and the fourth side 21A4, while exposing at least a portion of the surface (e.g., the second surface 15) of the resin member 10 between the inner periphery lower edge of the resin frame 50 and each of the fifth side 21A5, the sixth side 21A6, the seventh side 21A7 and the eighth side 21A8 of the large-width part 21A as seen in the top view. In this manner, in the light emitting device according to the embodiment, the resin frame 50 is formed to be substantially quadrangular as seen in the top view, and at least a portion of the second surface 15 is exposed at the four corners at the inner periphery lower edge of the substantially quadrangular resin frame 50. At least a portion of the second surface 15 exposed at the four locations is covered with the reflecting member 11 as will be described later.

Reflecting Member 11

As shown in FIG. 3A, the reflecting member 11 is preferably formed so, for example, the inner end (i.e., the side nearer to the center of the area surrounded by the resin frame 50) coincides with the boundary between the surface (e.g., the second surface 15) of the resin member 10 and the surface (e.g., the first surface 25) of the large-width part 21A of the first lead, and so that the outer end is positioned on the resin frame 50. The inner end of the reflecting member 11 does not necessarily perfectly coincide with the boundary, and may only cover most of the surface (e.g., the second surface 15) of the resin member 10. So long as the light emitting element is exposed from the reflecting member 11. The reflecting member 11 may cover part of the surface (e.g., the first surface 25) of the first lead 20A. In the light emitting device according to the embodiment, the reflecting member 11 may be formed to cover the surface (e.g., the second surface 15) of the resin member 10 inward of the resin frame 50 by substantially a constant thickness, however, preferably the reflecting member 11 is formed to have a thickness gradually greater toward the resin frame 50. In this manner, when the reflecting member 11 is formed to have a thickness gradually greater toward the resin frame 50 so that the surface of the reflecting member 11 is inclined, light emitted by the light emitting element is reflected upward (in the light extraction direction) by the inclined surface of the of the reflecting member 11, thereby improving the light extraction efficiency. Further, when the resin frame is formed in a shape having corners such as a quadrangle, the corners are covered with the reflecting member 11. Thus, irregular reflection of light is less likely to occur and light extraction efficiency can further be improved. Further, the inclination angle of the surface of the reflecting member 11 relative to the second surface 15 at the inner end of the reflecting member 11 away from the resin frame 50 is preferably smaller than the internal angle of the resin frame 50 at the inner periphery end. In other words, the reflecting member 11 is preferably formed so that the inclination angle of the lower edge (e.g., the lower edge apart from the resin frame 50) of the inclined surface of the reflecting member 11 becomes smaller than the internal angle of the inner periphery lower edge of the resin frame 50. Thus, the light extraction efficiency further improves.

In the above-described light emitting device according to the embodiment, at the upper surface of the base member 30 inward of the resin frame 50, the exposed at least a portion of the outer periphery of the surface (e.g., the first surface 25) of the large-width part 21A of the first lead is positioned inwardly apart from the inner periphery lower edge of the resin frame 50. At least a portion of the surface (e.g., the second surface 15) of the resin member 10 is exposed between the portion of the outer periphery of the first surface 25 and the inner periphery lower edge of the resin frame 50. The reflecting member 11 is formed at the exposed portion of the surface (e.g., the second surface 15) of the resin member 10. Accordingly, light emitted by the light emitting element is less likely to be absorbed by the resin member 10, thereby achieving a light emitting device exhibiting high light extraction efficiency.

Further, in the above-described light emitting device according to the embodiment, despite the surface (e.g., the second surface 15) of the resin member 10 being exposed at an area inward of the resin frame 50, the reflecting member 11 formed on the second surface 15 can alleviate light absorption by the resin member 10. Thus, the restrictions in terms of structure and manufacturing processes can be reduced without the necessity of excessively reducing the area of the surface (e.g., the second surface 15) of the resin member 10 exposed at an area inward of the resin frame 50. Thus, flexibility in designing the structure and manufacturing processes can be improved.

For example, without the necessity of excessively taking into consideration of light absorption, the structural design and the material selection of the resin member 10 may be more appropriately performed in view of the functions of the resin member 10, that is, the insulation between the first lead 20A and the second lead 20B and supporting the first lead 20A and the second lead 20B. Thus, a highly reliable light emitting device is provided.

Further, the regions for injecting the molding resin forming the resin member 10 can be secured by a relatively wide range, to thereby improve efficiency in the filling process. This may reduce the time required for filling and improve the yield in molding the resin member 10. Thus, the light emitting device is manufactured cost-effectively.

The foregoing advantages may contribute to providing a highly reliable light emitting device with reduced size.

In the above-described light emitting device according to the embodiment, the second surface 15 is exposed at four locations around the first surface 25 inward of the resin frame 50, and all of the four locations of the second surface 15 are covered with the reflecting member 11.

However, it is sufficient so long as at least one location of the second surface 15 is covered with the reflecting member 11, but not required that all of the four locations of the second surface 15 are covered with the reflecting member 11. For example, out of a plurality of locations of the second surface 15 exposed inward of the resin frame 50, only one location with a relatively great exposure area may be covered.

Further, exposure of the second surface 15 inward of the resin frame 50 is required at one location, but not necessarily required at four locations or a plurality of locations.

Figure 3C:
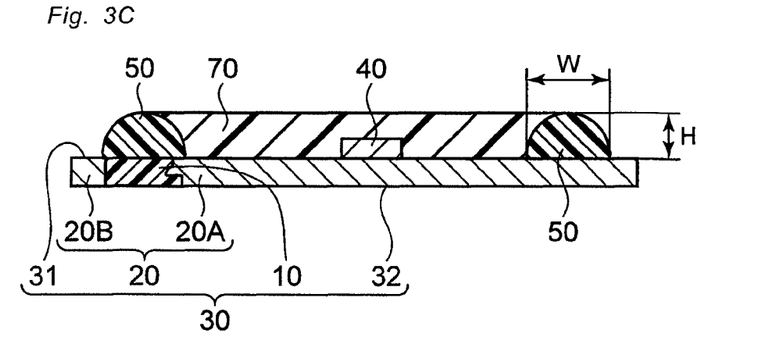
FIG. 3C is a cross-sectional view taken along line C-C in FIG. 1.
Figure 4:
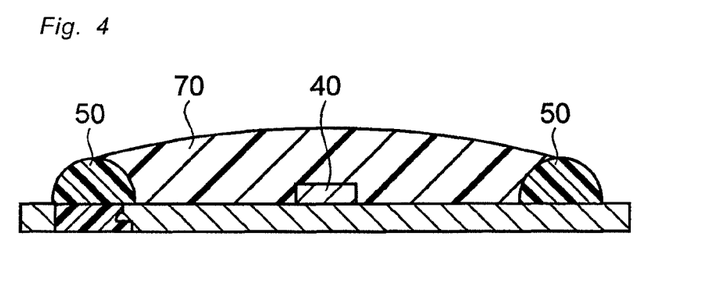
FIG. 4 is a cross-sectional view of a light emitting device according to a first variation of the embodiment of the present disclosure.

In the above-described light emitting device according to the embodiment, for example, as shown in FIG. 3C, the encapsulation member 70 with a flat upper surface is used. However, the encapsulation member 70 is not required to have a flat upper surface. As shown in FIG. 4, a lens-shaped encapsulation member having a curved upper surface may be used.

Figure 5:
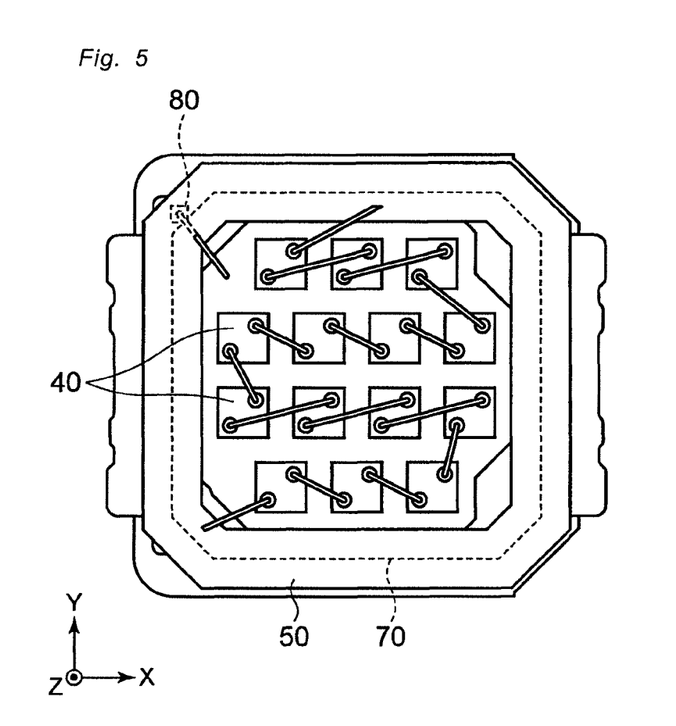
FIG. 5 is a top view of a light emitting device according to a second variation of the embodiment of the present disclosure.

In the above-described light emitting device according to the embodiment, the description has been given of the light emitting device including one light emitting element 40. However, as shown in FIG. 5, in the light emitting device according to the embodiment, a plurality of light emitting elements may be used, and the resin frame 50 may be formed to collectively surround the plurality of light emitting elements 40. Further, the light emitting device according to the embodiment may include a protective element 80. As shown in FIG. 5, the protective element 80 may be embedded in the resin frame 50, for example.

Figure 6:
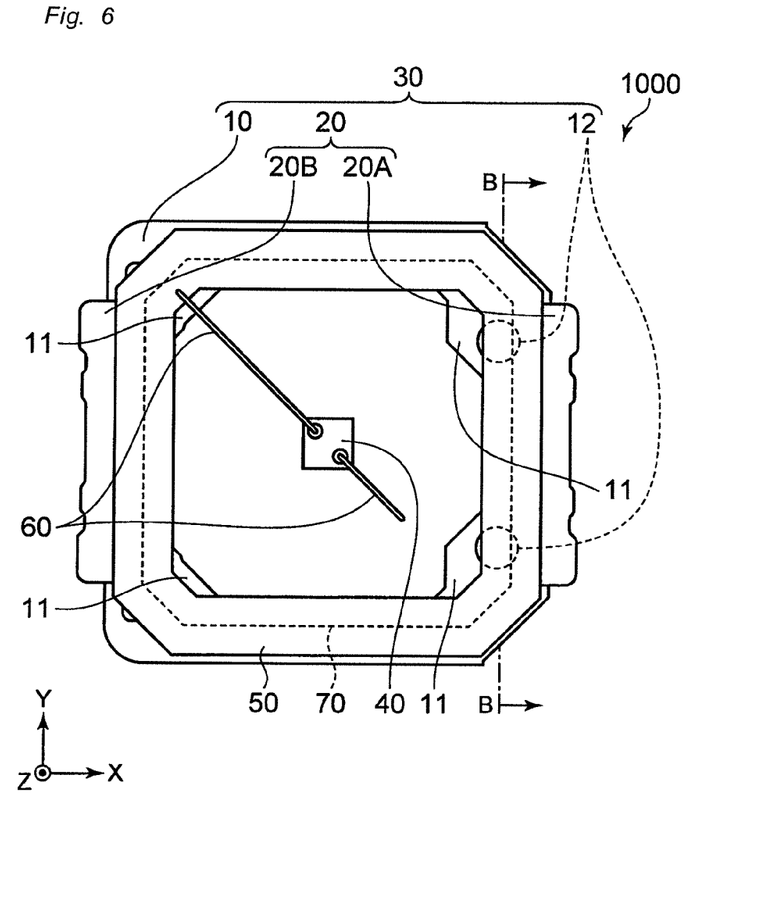
FIG. 6 is a top view of a light emitting device according to a third variation of the present disclosure.
Figure 7:
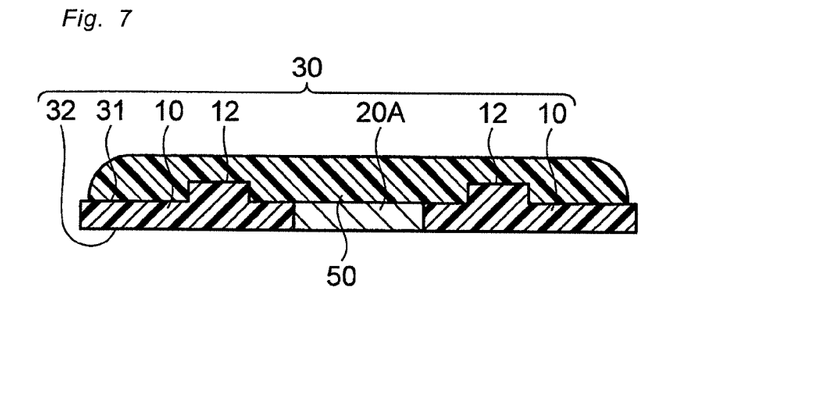
FIG. 7 is a cross-sectional view taken along line B-B in FIG. 6.

In the above-described light emitting device according to the embodiment, as shown in FIGS. 6 and 7, one or more projections 12 may be formed at the upper surface of the resin member 10 at the upper surface of the base member 30. By forming the projections 12 at the upper surface of the resin member 10 at the upper surface of the base member 30, and forming the resin frame 50 so as to cover the projections 12, the bonding strength between the base member 30 and the resin frame 50 can be enhanced.

In the following, a description will be given of materials and other parameters suitable for the constituent members of the light emitting device according to the embodiment.

Reflecting Member 11

The reflecting member 11 covers the second surface 15 of the resin member 10 exposed inward of the resin frame 50.

The material of the reflecting member 11 may be phenolic resin, epoxy resin, BT resin, PPA, or silicone resin. In particular, the material of the reflecting member 11 is preferably silicone resin which has good light resistance. Using a resin material in both the reflecting member 11 and the resin member 10 will improve adhesion between the reflecting member 11, the resin member 10, and the resin frame 50. Further, the base material resin of these member can contain reflecting powder that is less likely to absorb light from the light emitting element 40 and has a large refractive index difference from the base material resin when the reflecting powder is dispersed in the base material resin. Thus light from the light emitting element 40 can efficiently be reflected. The reflecting powder may be, for example, titanium oxide, aluminum oxide, zirconium oxide, or magnesium oxide. In particular, titanium oxide is preferable because titanium oxide is relatively stable to moisture and has a high refractive index. The reflecting member 11 is a member that exhibits a reflectivity of 60% or more, preferably 70% or more, with respect to light from the light emitting element 40.

As has been described with reference to FIG. 3A, the reflecting member 11 is preferably formed so that, for example, the inner end (i.e., the side nearer to the center of the resin frame 50) coincides with the boundary between the surface (e.g., the second surface 15) of the resin member 10 and the surface (e.g., the first surface 25) of the large-width part 21A of the first lead, and the outer end is positioned on the resin frame 50. Further, the reflecting member 11 is preferably formed to have a thickness gradually increasing toward the resin frame 50. The reflecting member 11 having such a shape can be formed by, for example, adjusting the viscosity and application amount of the resin material as appropriate when forming the reflecting member 11 by applying a difference in wettability between the surface (e.g., the second surface 15) of the resin member 10 and the surface (e.g., the first surface 25) of the large-width part 21A of the first lead. Specifically, the surface (e.g., the second surface 15) of the resin member 10 is higher in wettability than the surface (e.g., the first surface 25) of the large-width part 21A of the first lead which is a metal surface, because of the difference in smoothness. Accordingly, when a material resin having relatively low viscosity is applied to the surface (e.g., the second surface 15) of the resin member 10, the inner end (i.e., the side nearer to the center of the resin frame 50) can coincide with the boundary between the surface (e.g., the second surface 15) of the resin member 10 and the surface (e.g., the first surface 25) of the large-width part 21A of the first lead. Further, the reflecting member 11 can be formed to have a thickness gradually increasing away from the boundary. Still further, the inclination or curved shape of the surface of the reflecting member 11 can be adjusted by adjusting the viscosity and application amount of the applied resin.

Resin Member 10

The material of the resin member 10 may be epoxy resin, silicone resin, BT resin, polyamide resin, polyimide resin, nylon resin, or unsaturated polyester. The resin member 10 can be formed using any of these resin materials containing any coloring agent, filler, reinforcing fibers and the like known in the art. Further, by adding such resin containing black-color filler such as carbon black which has a great heat dissipation coefficient, heat from the light emitting element can efficiently be dissipated. Commonly, when the resin member 10 contains black-color filler such as carbon black, the resin member 10 actively absorbs light, thereby reducing the light extraction efficiency of the light emitting device. However, in the light emitting device according to the embodiment, the surface (e.g., the second surface 15) of the resin member 10 exposed inward of the resin frame 50 is covered with the reflecting member 11, to thereby prevent or alleviate light absorption by the resin member 10, and alleviate reduction in light extraction efficiency of the light emitting device. The filler may be silicon oxide, aluminum oxide or the like. The reinforcing fibers may be glass, calcium silicide, potassium titanate or the like.

Conductive Member 20

The conductive member 20 is used in order to apply a voltage from an external power supply to the electronic components such as the light emitting element 40. The conductive member 20 includes the first lead 20A and the second lead 20B.

The conductive member 20 is preferably formed using a material having relatively high thermal conductivity. For example, using a material exhibiting a thermal conductivity of about 200 W/(m·K) or more allows heat generated at the light emitting element 40 to be easily transferred to the first lead 20A.

The conductive member 20 is preferably formed using a material having a high strength while being easily processed by punching or cutting. For example, the base of the conductive member 20 may be a single layer or a layered body of metal such as copper, aluminum, gold, silver, tungsten, iron, nickel, palladium, or rhodium, or an alloy of such metals, phosphor bronze, copper-iron alloy or the like. The metal layer may be provided to the entire or part of the first lead 20A and the second lead 20B, or one of the first lead 20A and the second lead 20B.

The conductive member 20 may be provided with a reflecting layer at its surface. The reflecting layer may be formed using one or more types of metals including aluminum, copper, gold and the like. In particular, the reflecting layer is preferably formed using silver. This can improve the light extraction efficiency of the light emitting device.

The reflecting layer may be formed at the conductive member 20 by a method, for example, plating, vapor deposition, sputtering, and ion beam assisted deposition. The thickness of the reflecting layer can be determined such that light from the light emitting element 40 can be sufficiently effectively reflect, and in a range of, for example, about 20 nm to 10 μm, preferably about 50 nm to 5 μm, and further preferably about 100 nm to 3 μm. The thickness and shape of the conductive member may be determined as appropriate in the range known in the art.

As shown in FIG. 2A, the end surface of the first lead 20A and/or the second lead 20B preferably has irregular shapes. Provision of the irregular shapes at the region where the first lead 20A and/or the second lead 20B and the resin member 10 are in contact with each other can increase the contact area between the first lead 20A and/or the second lead 20B and the resin member 10. This can improve the adhesion between the first lead 20A and/or the second lead 20B and the resin member 10.

Light Emitting Element 40

The light emitting element 40 is disposed on the first surface 25 of the first lead 20A. The light emitting element 40 is a semiconductor element that emits light when voltage is applied, and may be a known semiconductor element formed using a nitride semiconductor or the like. The emission wavelength of the light emitting element may be selected from the ultraviolet range to the infrared range including the visible range (380 nm to 780 nm). For example, a light emitting element of which peak wavelength is in a range of 430 nm to 490 nm may be a nitride semiconductor. The nitride semiconductor may be $In_XAl_YGa_{1-X-Y}N$ ($0 \leq X$, $0 \leq Y$, $X+Y \leq 1$). Further, the light emitting element 40 may be disposed on the first surface 25 via a submount.

The shape of the light emitting element 40 may be, as seen in the top view, a polygon such as a triangle, a quadrangle, a hexagon, or any shape similar to the foregoing shapes. Further, the light emitting element 40 may be of a single-sided electrode type in which the n-electrode and the p-electrode are formed at an identical surface, or may be of a double-sided electrode type in which the n-electrode and the p-electrode are respectively formed on two opposite surfaces, for example, the upper surface and the lower surface.

When the light emitting element 40 has the single-side electrode structure, the light emitting element 40 is face-up mounted on the first surface 25 of the first lead 20A. The face-up mounting provides a structure in which the light emitting element 40 is mounted such that its surface opposite to the electrode formed surface face the base member 30. The bonding member for bonding the light emitting element 40 and the first lead 20A to each other may be insulating or conductive, and a known bonding member may be used. For example, the insulating bonding member may be epoxy resin, silicone resin, or modified resin of the foregoing resins. The conductive bonding member may be conductive paste of silver, gold, palladium or the like, solder such as Au—Sn eutectic solder, or a brazing material such as low melting point metal.

When the light emitting element 40 has the double-sided electrode structure, the bonding member for bonding the light emitting element 40 and the first lead 20A to each other may be a conductive member known in the art. For example, the conductive bonding member may be conductive paste of silver, gold, palladium or the like, solder such as Au—Sn eutectic solder, or a brazing material such as low melting point metal. In this case, electrical connection between the light emitting element 40 and the first lead 20A is achieved by mounting the light emitting element on the first lead 20A.

Resin Frame 50

The resin frame 50 is provided to surround the light emitting element 40 in a frame-like shape. The resin frame 50 is provided to surround the light emitting element 40, thus the uncured material, which will be the encapsulation member 70, can be retained inward of the resin frame 50. The resin frame 50 is formed by disposing an uncured material to be the resin frame 50 at the region where the resin frame 50 is desired to be formed, and curing the material.

The material of the resin frame 50 may be, phenolic resin, epoxy resin, silicone resin, BT resin, or PPA. In particular, the material of the resin frame 50 is preferably silicone resin which has good light resistance. Further, the base material resin of the resin frame 50 can contain reflecting powder that is less likely to absorb light from the light emitting element 40 and has a large refractive index difference from the base material resin in a state that the reflecting powder is dispersed in the base material resin. The reflecting powder may be, for example, titanium oxide, aluminum oxide, zirconium oxide, or magnesium oxide. In particular, titanium oxide is preferable because it is relatively stable to moisture and the like, and has high refractive index. The resin frame 50 is a member that exhibits a reflectivity of 60% or more, preferably 70% or more, with respect to light from the light emitting element 40. In such a structure, light reaching the resin frame 50 is less likely to be absorbed by the resin frame 50, to thereby improve the light extraction efficiency of the light emitting device.

Wire 60

The light emitting element 40 and the second lead 20B may be electrically connected to each other via the wire 60. The wire 60 may be formed using a metal material which exhibits good conductivity. The metal material may be gold, aluminum, copper, or silver. The wire bonding may be performed by a known method such as ball bonding, wedge bonding and the like.

Encapsulation Member 70

The material of the encapsulation member 70 may be a light-transmissive resin or glass material. In particular, the resin material is preferable as the material of the encapsulation member 70. The reflecting member 11 and the resin frame 50 each contain a resin material, the encapsulation member 70 also formed using a resin material can improve adhesion between the encapsulation member 70 and the reflecting member 11, and adhesion between the encapsulation member 70 and the resin frame 50. The resin material of the encapsulation member 70 may be polycarbonate resin, epoxy resin, phenolic resin, silicone resin, acrylic resin, polymethylpentene resin, or polynorbornene resin, modified resin of the foregoing resins, or hybrid resin containing at least one of the foregoing resins. In particular, the material of the encapsulation member 70 is preferably dimethyl-based silicone resin or phenyl-based silicone resin because it is good in light resistance.

The encapsulation member 70 may contain a wavelength conversion member and/or a light diffusing member.

Wavelength Conversion Member

The wavelength conversion member may be particles of a fluorescent material capable of being excited by light from the light emitting element. For example, a fluorescent material capable of being excited by a blue-color light emitting element or an ultraviolet light emitting element may be a cerium-activated yttrium-aluminum-garnet-based fluorescent material (YAG:Ce), a cerium-activated lutetium-aluminum-garnet-based fluorescent material (LAG:Ce), a europium and/or chromium-activated nitrogen-containing calcium aluminosilicate-based fluorescent material (CaO—Al$_2$O$_3$—SiO$_2$:Eu,Cr), a europium-activated silicate-based fluorescent material ((Sr,Ba)$_2$SiO$_4$:Eu), a nitride-based fluorescent material such as a β-SiAlON fluorescent material, a CASN-based fluorescent material, or an SCASN-based fluorescent material, a fluoride-based fluorescent material such as a KSF-based fluorescent material, a sulfide-based fluorescent material, a chloride-based fluorescent material, a silicate-based fluorescent material, a phosphate-based fluorescent material, or a quantum dot fluorescent material. A combination of any of these fluorescent materials and a blue-color light emitting element or an ultraviolet light emitting element can provide a light emitting device emitting light having various wavelength.

Light Diffusing Member

The light diffusing member may be titanium oxide, zirconium oxide, aluminum oxide, or silicon oxide. In particular, titanium oxide is preferable because it is relatively stable to moisture and the like, and has high refractive index.

Protective Element 80

The protective element 80 may be a protective circuit or an electrostatic protective element that is capable of, for example, preventing reverse flow of current when voltage is reversely applied to the light emitting element 40, and capable of preventing overcurrent from flowing into the light emitting element when a forward voltage being higher than the operating voltage of the light emitting element 40 is applied. Specifically, the protective element 80 may be a Zener diode.

What is claimed is:

1. A light emitting device comprising:
    a base member comprising:
        a first lead,
        a second lead, and
        a resin member supporting the first lead and the second lead,
        wherein each of a surface of the first lead, a surface of the second lead, and a surface of the resin member are positioned at an upper surface of the base member;
    one or more light emitting elements located at the surface of the first lead that forms a portion of the upper surface of the base member;
    a resin frame located at the upper surface of the base member so as to surround one or more light emitting elements, wherein, in a top view, the resin frame is substantially quadrangular, and an inner peripheral lower edge of the resin frame is substantially quadrangular;
    a Zener diode disposed on the surface of the second lead that forms a portion of the upper surface of the base member, the Zener diode being embedded in a corner portion of the resin frame; and
    a wire connecting the Zener diode and the first lead, wherein a first end portion of the wire that is connected to the Zener diode is embedded in the resin frame, and a second end portion of the wire that is connected to the first lead is exposed from the resin frame; wherein:
    the surface of the first lead includes a first surface that is exposed inward of the resin frame,
    the surface of the resin member includes a second surface that is exposed inward of the resin frame
    four peripheral portions of the first surface are positioned inward of and apart from four corner portions of the inner peripheral lower edge of the resin frame, the second surface has four exposed surface portions that are exposed between the four corner portions of the inner peripheral lower edge and the four peripheral portions of the first surface, and the light emitting device further comprises four separate reflecting members covering the four exposed surface portions at locations spaced from the one or more light emitting elements, each of the four separate reflecting members having a thickness that gradually increases toward the resin frame, and an inclination angle of a surface of each of the four separate reflecting members relative to the second surface at an inner end of the reflecting member apart from the resin frame is smaller than an internal angle of the resin frame at an inner end of the resin frame.

2. The light emitting device according to claim 1, wherein the inner end of each reflecting member coincides with a boundary between the first surface and the second surface.

3. The light emitting device according to claim 1, wherein:

the first lead and the second lead form a conductive member, and the conductive member includes a reflecting layer disposed at a surface thereof.

4. The light emitting device according to claim 1, wherein the one or more light emitting elements comprise a plurality of light emitting elements.

* * * * *